United States Patent [19]
Kroeker

[11] Patent Number: 6,000,227
[45] Date of Patent: Dec. 14, 1999

[54] WAFER COOLING IN A TRANSFER CHAMBER OF A VACUUM PROCESSING SYSTEM

[75] Inventor: Tony R. Kroeker, Georgetown, Tex.

[73] Assignee: Applied Materials, Inc., Santa Clara, Calif.

[21] Appl. No.: 08/936,131

[22] Filed: Sep. 24, 1997

[51] Int. Cl.⁶ ..................................................... F25D 25/00
[52] U.S. Cl. ................................................................. 62/62
[58] Field of Search ....................................................... 62/62

[56] References Cited

U.S. PATENT DOCUMENTS

| | | | |
|---|---|---|---|
| 5,220,171 | 6/1993 | Hara et al. | 250/443.1 |
| 5,516,732 | 5/1996 | Flegal | 437/250 |
| 5,522,215 | 6/1996 | Matsunaga et al. | 62/3.2 |
| 5,638,687 | 6/1997 | Mizohata et al. | 62/62 |

*Primary Examiner*—William Doerrler
*Attorney, Agent, or Firm*—Thomason, Moser & Patterson

[57] ABSTRACT

A vacuum processing system has a wafer cooling system disposed on a lid of a transfer chamber so that heated wafers are cooled inside the transfer chamber. The wafer cooling system has a wafer lift assembly and a wafer cooler. The wafer cooler has a cooling plate and a coolant tank disposed through the transfer chamber lid. The wafer lift assembly has a lift actuator disposed on the top of the transfer chamber lid, guide rods to translate the lifting motion through the lid, and wafer supports inside the lid to raise the wafer to a position proximate to the cooling plate. The wafer cools by radiating heat up to the cooling plate, and the coolant tank transfers the heat from the cooling plate.

19 Claims, 5 Drawing Sheets

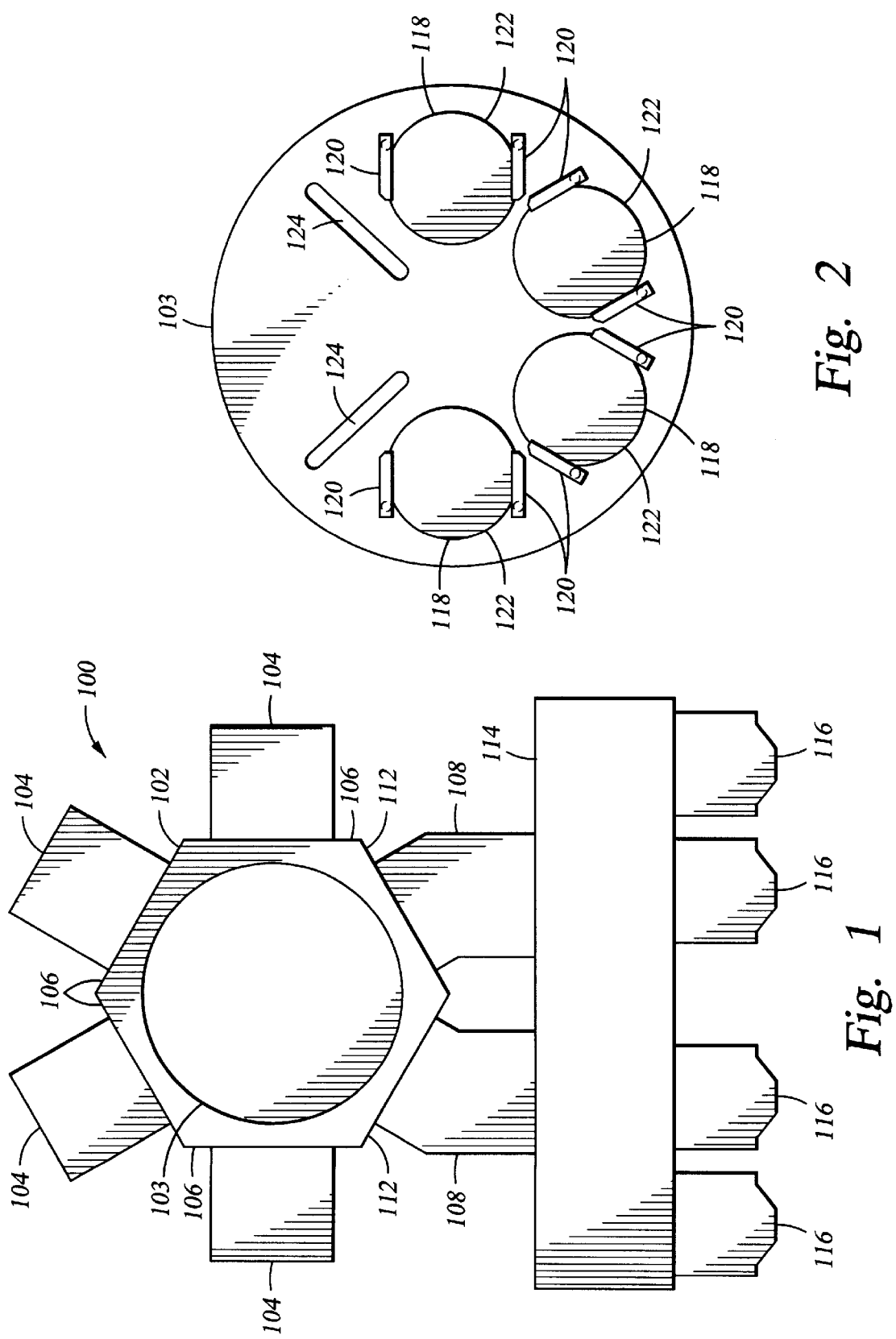

WAFER COOLING IN A TRANSFER CHAMBER OF A VACUUM PROCESSING SYSTEM

FIELD OF THE INVENTION

This invention generally relates to vacuum processing systems. Specifically, this invention relates to methods and apparatuses for cooling wafers that are being processed in a vacuum processing system.

BACKGROUND OF THE INVENTION

Vacuum processing systems for processing 100 mm, 200 mm, 300 mm or other diameter wafers are generally known. Typically, such a vacuum processing system has a centralized transfer chamber mounted on a monolith platform. The transfer chamber is the center of activity for the movement of wafers being processed in the system. Wafers are in the transfer chamber only long enough to be transferred therethrough to another chamber for storing or processing. One or more process chambers attach to the transfer chamber at valves through which wafers are passed by a robot in the transfer chamber. The valves close in order to isolate the process chambers while wafers are being processed therein. Physically, the process chambers are either supported by the transfer chamber and its platform or are supported on their own platform. Inside the system, the transfer chamber is typically held at a constant vacuum; whereas, the process chambers may be pumped to a greater vacuum for performing their respective processes.

Afterward, the process chamber's pressure must be returned to the level in the transfer chamber before opening the valve to permit access between the chambers.

Access to the transfer chamber for wafers from the exterior of the system, or from the manufacturing facility, is typically through one or more load lock chambers. The load lock chambers cycle between the pressure level of the ambient environment and the pressure level in the transfer chamber in order for the wafers to be passed therebetween, so the load lock chambers transition the wafers between the atmospheric pressure of a very clean environment to the vacuum of the transfer chamber.

Some common transfer chambers have facets for four to six process chambers and load lock chambers. For a six-faceted transfer chamber, typically two of the facets are for load lock chambers, and the other four facets are for process chambers. The process chambers include rapid thermal processing (RTP) chambers, physical vapor deposition (PVD) chambers, chemical vapor deposition (CVD) chambers, etch chambers, etc. The productivity of a vacuum processing system is increased when more process chambers are mounted to the transfer chamber, because more wafers can be processed at a given time. Additionally, less; space is required in the manufacturing facility if the productivity of the system is maximized.

Some of the processes performed by the process chambers cause the wafers processed therein to be heated. For some of the processes, the heating is incidental to the process; but for some other processes the heating is a significant part of the process, and for some of these processes, such as RTP, the heating is the process. A process may require that a wafer be cooled before it is placed back into the load lock chamber after processing. For such processes, one or more of the facets of the system mounts a cool-down chamber.

Generally, a cool-down chamber receives a heated wafer from the transfer chamber. The cool-down chamber typically has a plurality of lift pins that lift the wafer off of the blade of the robot, so the blade can be retracted out of the cool-down chamber, and then lowers the wafer onto a cooling plate. The cooling plate is disposed on the bottom of the cool-down chamber, and it is typically water cooled to increase the heat transfer rate. The close proximity of the wafer to the cooling plate permits the wafer to cool by radiating heat from the underside of the wafer to the cooling plate. After a sufficient time to cool the wafer has elapsed, typically a few seconds to a few minutes, the lift pins raise the wafer up again, the robot blade extends under the wafer, the lift pins lower the wafer onto the blade, and the robot removes the wafer from the cool-down chamber and transfers the wafer to a load lock chamber.

Since a cool-down chamber occupies one of the locations on the transfer chamber that could be occupied by a process chamber, the productivity potential, or throughput, of the vacuum processing system is decreased. Therefore, in order for a manufacturing facility to achieve the same throughput as would be achieved if each system had the maximum number of process chambers and no cool-down chambers, the manufacturing facility would have to increase the number of systems in the facility, which translates to an increase in the amount of floor space dedicated to these systems. Thus, the manufacturing costs increase.

A need, therefore, exists for a vacuum processing system that provides for cooling wafers without sacrificing a process chamber or system throughput.

SUMMARY OF THE INVENTION

A vacuum processing system has a wafer cooling system built into the transfer chamber, so the vacuum processing system does not have to have a dedicated cool-down chamber. The wafer cooling system has a wafer lift assembly and a wafer cooler built into the lid of the transfer chamber. The transfer chamber robot can perform normal wafer transfers between the process chambers and load lock chambers under the wafer cooling system. For those processes that require the wafer to be cooled before transferring it to another chamber, the wafers may be held in the wafer cooling system until the wafers are sufficiently cooled. In the cooling method, the wafer lift assembly is lowered in order to receive a heated wafer, the transfer chamber robot places a wafer above the wafer lift assembly, the wafer lift assembly raises the wafer off of the robot to a position very close (about 20 mils) to the cooling plate, the wafer cools by radiating heat from its topside to the wafer cooler, the wafer lift assembly lowers the wafer (about an inch) to set it on the robot, and then the robot transfers the wafer to the next chamber.

A wafer cooling system is disposed adjacent each process chamber, so each wafer cooling system is aligned with the slit valve between the process chamber and the center of the transfer chamber. In this configuration, the robot transfers a wafer in a single motion out of the process chamber and directly into the wafer cooling system, rather than having to go through additional movements to transfer the wafer to a cooling system. Thus, the time to transfer a wafer from a process chamber to a wafer cooling system is greatly reduced over that of a system having a cool-down chamber.

Alternatively, there may be fewer wafer cooling systems than process chambers. For example, there may be four process chambers and only three wafer cooling systems. In this case, the wafer cooling systems may be offset from the openings between the process chambers and the transfer chamber. Therefore, the robot will have to go through additional movements to transfer the wafer to the wafer cooling system, but the average time to transfer the wafer from a process chamber to a wafer cooling system will be less than the average time required to transfer a wafer from a process chamber to a cool-down chamber, since the distance traveled is less when the robot doesn't have to reach outside the transfer chamber.

The wafer lift assembly has a lift actuator, such as an air-operated cylinder with a piston, mounted on the topside of the lid of the transfer chamber. The vertical motion of the lift actuator is translated through the lid by guide rods. The guide rods attach to wafer supports inside the transfer chamber through an expandable bellows system that prevents air leaks into the transfer chamber. The wafer supports hold the wafer and, by the vertical motion of the lift actuator, raise and lower the wafer.

The wafer cooler mounts in the lid of the transfer chamber with the lift actuator above the wafer cooler, the guide rods beside the wafer cooler and the wafer supports below the wafer cooler, so the wafer on the wafer supports can be lifted very close to the wafer cooler. The bottom side of the wafer cooler has a cooling plate for receiving the radiated heat from the wafer. The cooling plate is cooled by circulating a coolant fluid, such as water, in and out of a coolant fluid tank disposed adjacent and above the cooling plate.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 1 is a top view of a schematic of a vacuum processing system incorporating the present invention.

FIG. 2 is a bottom view of a transfer chamber lid having four wafer cooling systems thereon.

DETAILED DESCRIPTION OF A PREFERRED EMBODIMENT

Figure 3:
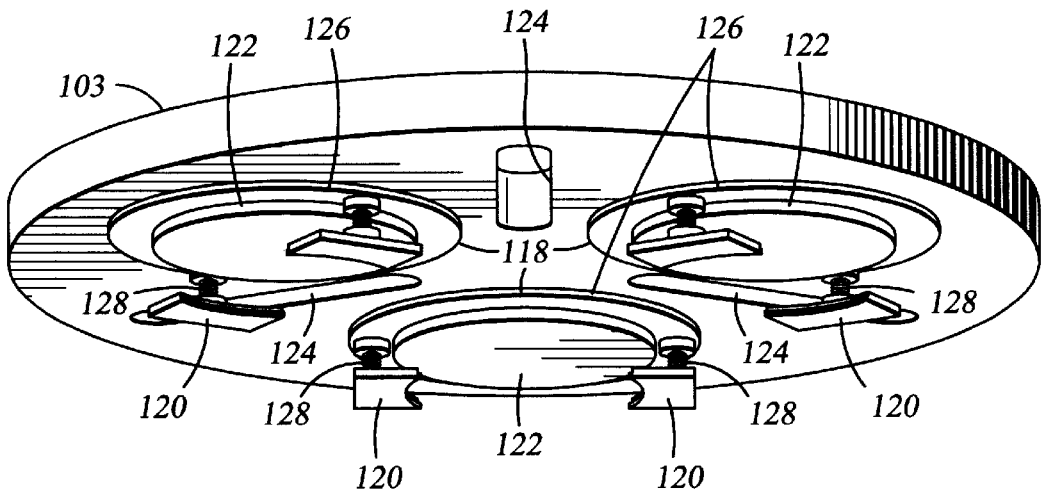
FIG. 3 is a bottom perspective view of a transfer chamber lid having three wafer cooling systems thereon.

FIG. 1 generally shows a schematic top view of a vacuum processing system 100 incorporating the present invention. This system 100 is of the type of systems that are typically used for manufacturing integrated circuits on wafers in a vacuum. The vacuum processing system 100 includes a transfer chamber 102 typically mounted on a platform (not shown). The transfer chamber 102 has a lid 103 mounted on its top. The lid 103 can be removed in order to service the inside of the transfer chamber 102. When it is attached, the lid 103 forms an airtight seal with the transfer chamber 102, so that when the pressure in the transfer chamber is reduced to a vacuum, air does not leak into the transfer chamber 102. In accordance with the invention, one or more cooling systems are disposed through the lid 103 in order to provide a means to cool a wafer within the transfer chamber 102, instead of in a separate cool-clown chamber.

The transfer chamber 102 has process chambers 104 attached at facets 106. Process chambers 104 may be any type of process chamber, such as a physical vapor deposition chamber, a chemical vapor deposition chamber, an etch chamber, etc. It is not uncommon for a manufacturer of process chambers to provide over twenty different types of process chambers. The process chambers 104 may be supported by the transfer chamber 102 or may be supported on their own platforms depending on the configuration of the individual process chambers 104. Slit valves (not shown) in the facets 106 provide access and isolation between the transfer chamber 102 and the process chambers 104. Correspondingly, the process chambers 104 have openings (not shown) on their surfaces that align with the slit valves. The transfer chamber 102 also has two load lock chambers 108 mounted at facets 112. Openings (not shown) in the facets 112 provide access and isolation between the load lock chambers 108 and the transfer chamber 102. Correspondingly, the load lock chambers 108 have openings on their surfaces that align with the openings in facets 112.

The load lock chambers 108 are attached to mini-environment 114. The load lock chambers 108 and the mini-environment 114 have corresponding openings (not shown) providing access therebetween, while doors (not shown) for the openings provide isolation. The mini-environment 114 has four pod loaders 116 attached on its front side. Openings (not shown) with corresponding doors (not shown) provide access and isolation between the mini-environment 114 and the pod loaders 116.

In operation, wafer pods, or wafer cassettes, (not shown) containing wafers to be processed in the system 100 are placed on the top of the pod loaders 116. Then a robot (not shown) begins removing the wafers, one at a time, out of the wafer pods and into one of the load lock chambers 108. After all of the wafers have been loaded into the load lock chamber 108, the pressure in the load lock chamber is reduced to match that in the transfer chamber 102. Then the door on the transfer chamber side is opened, and the transfer chamber robot (not shown) can begin servicing the load lock chamber 108. The transfer chamber robot moves the wafers from the load lock chamber 108 to one of the process chambers 104 for processing, and afterwards moves the wafers back to one of the load lock chambers 108. When the load lock chamber 108 has received all of the processed wafers, the pressure in the load lock chamber is returned to that of the mini-environment, so the robot within the mini-environment can move the processed wafers back to a wafer pod 116.

Some of the processes that a vacuum processing system 100 may perform on a wafer in the process chambers 104 may heat the wafer, either in a preheat cycle prior to processing the wafer or as part of the process or as a side effect of the process. For example, rapid thermal processing heats the wafer to about 750° C. in less than a minute in order to heat-treat a wafer, such as for annealing. Other processes may cause the wafer to heat up to varying degrees. In some cases where the wafer has not been heated too high, less than 100° C., the wafer may be placed directly back into the load lock chamber 108 from the process chamber 104 without first cooling the wafer. Other processes, however, may require that the wafer be cooled prior to replacing it into the load lock chamber 108.

In order to cool a wafer, the wafer may be held in close proximity, about 20 mils, to a wafer cooler. Heat is transferred to the wafer cooler for about 30 seconds or more, depending on the initial temperature of the wafer. Since the wafer is not touching the cooler, cooling is not done by conduction. Since the vacuum processing system is held at a vacuum, very little cooling is done by convection. Therefore, most of the cooling is done by radiation of heat to the cooler.

FIG. 2 shows one embodiment for an arrangement of a wafer cooling system 118 disposed on the transfer chamber lid 103. The transfer chamber lid 103 is also shown with two wafer center finders 124 used to determine wafer position within the system. In this embodiment, four wafer cooling systems 118 are shown. Each cooling system 118 has a pair of wafer supports 120 (part of a wafer lift assembly described below with reference to FIGS. 5–8) for holding a wafer adjacent to a wafer cooler 122. The wafer supports 120 are lowered to a receiving position below the plane of the robot to place a wafer on the transfer chamber's robot blade or to prepare to receive a wafer therefrom. The supports 120 are raised to lift a wafer off of the robot blade and support the wafer proximate to the cooler 122.

With four wafer cooling systems 118, it is possible to arrange them so that each one aligns with a slit valve in the transfer chamber 102 for accessing a process chamber 104. In such a configuration, the transfer chamber's robot can move a wafer out of a process chamber 104, through the slit valve and into position above the supports 120 of the corresponding cooling system 118 in a single movement of the robot blade. The supports 120 then raise the wafer, and the robot can immediately proceed to service another wafer or chamber.

An alternative embodiment for arranging wafer cooling systems 118 on the underside of a transfer chamber's lid 103 is shown in the perspective view of FIG. 3. In this embodiment, three wafer cooling systems 118 are shown protruding through the lid 103 with a mounting plate 126 attached to the lid 103, and the wafer cooler 122 attached to or integral with the mounting plate 126, and part of the wafer lift assembly extending through the mounting plate with bellows 128 and supports 120. A guide rod (shown in FIGS. 5–9) extends through the bellows 128 and attaches to the wafer supports 120 to raise and lower them. This configuration of wafer cooling systems 118 will be slower than the embodiment shown in FIG. 2 because additional movements are required to transfer a wafer out of a process chamber 104 to a wafer cooling system 118.

Figure 4:
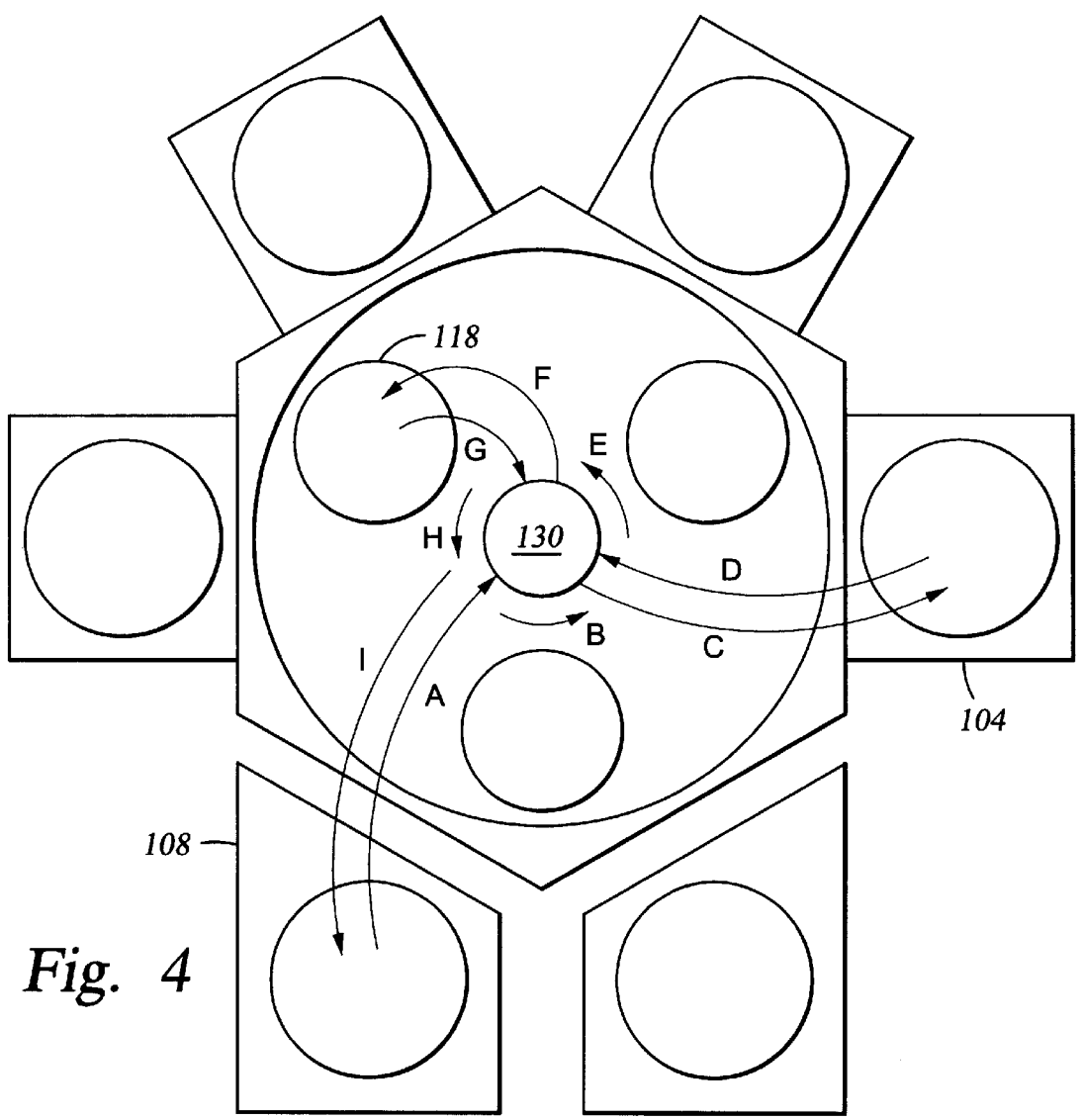
FIG. 4 is a top schematic view of a vacuum processing system showing an exemplary wafer movement method for a vacuum processing system having three wafer cooling systems.

Rather than a single movement directly out of a process chamber 104 and into a wafer cooling system 118, this embodiment requires three movements: one movement to withdraw the wafer from the process chamber 104, a second movement to rotate the robot toward the wafer cooling system 118, and a third movement to insert the wafer into the wafer supports 120. FIG. 4 shows the basic steps in this embodiment for a typical method of handling a wafer from the load lock chamber 108 and back. The arrows A-I represent the basic steps A-I, respectively. In step A, the transfer chamber's robot 130 removes a wafer from the load lock chamber 108. In step B, the robot 130 rotates to face the process chamber 104. In step C, the robot 130 places the wafer into the process chamber 104. After the process chamber 104 finishes its process on the wafer, in step D, the robot 130 removes the wafer from the process chamber 104. In step E, the robot 130 rotates to face the wafer cooling system 118. In step F, the robot 130 inserts the wafer into the wafer cooling system 118. After the wafer cooling system raises the wafer, cools it, and lowers it back down; in step G, the robot 130 retrieves the wafer from the wafer cooling system 118. In step H, the robot 130 rotates to face the load lock chamber 108. In step I, the robot 130 extends to insert the wafer into the load lock chamber 108. The previous embodiment is more advantageous since it is two steps shorter, and since an embodiment with fewer cooling systems may experience sequencing problems if a process needs to cool a wafer when there is no cooling system available.

Figure 5:
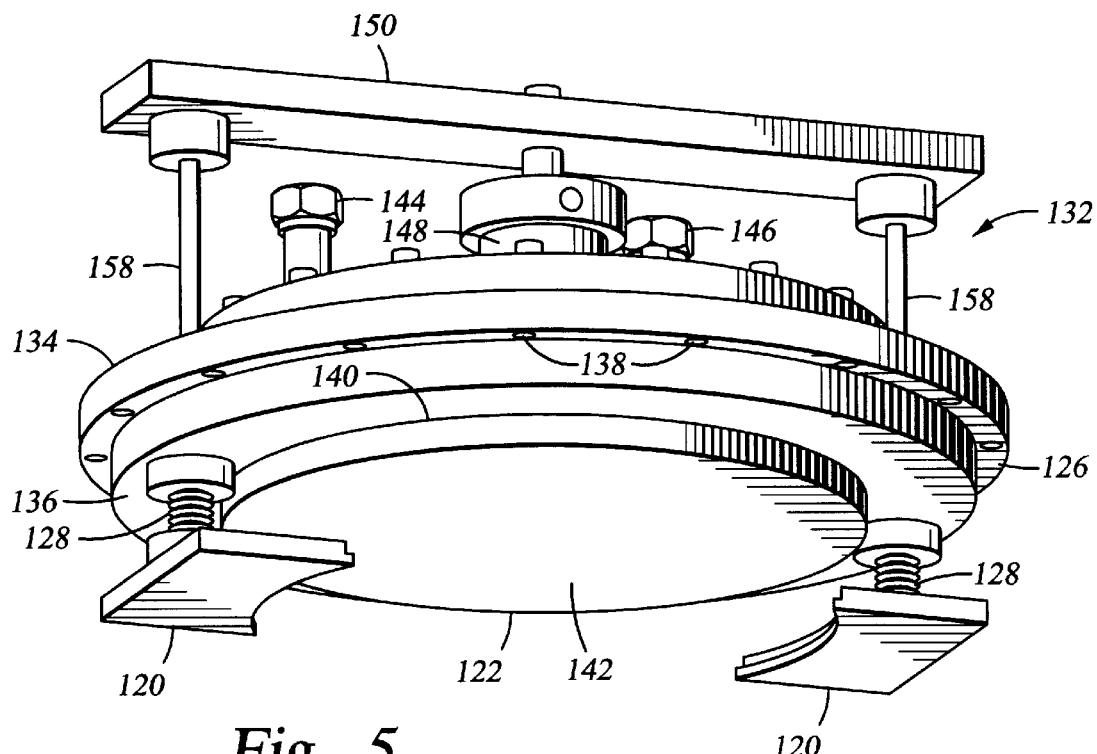
FIG. 5 is a bottom perspective view of an exemplary wafer cooling system.
Figure 6:
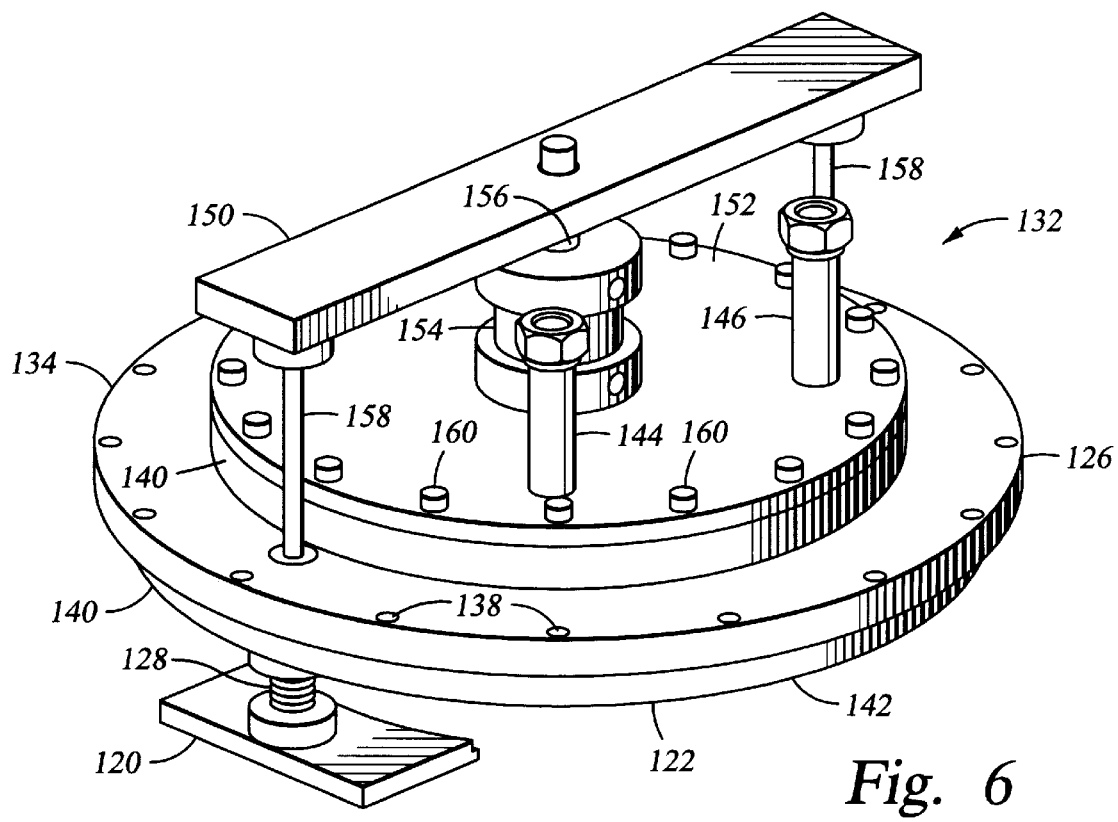
FIG. 6 is a top perspective view of another exemplary wafer cooling system.

FIGS. 5 and 6 show an underside perspective view and a topside perspective view of two embodiments of a wafer cooling system 132. The cooling system 132 has a mounting plate 126 for mounting in an opening in the transfer chamber's lid. The flange 134 of the mounting plate 126 sits on top of the lid, and the lower portion 136 is recessed in the opening into the interior of the transfer chamber. A series of screw holes 138 provides a means to connect the mounting plate 126 to the lid. A coolant tank 140 for the cooler 122 is disposed below the center of the mounting plate 126. The coolant tank 140 may be mounted on the mounting plate 126, or it may be formed integrally with the mounting plate 126. A cooling plate 142 forms the bottom of the coolant tank 140, and a coolant tank lid 152 seals the top of the tank 140. A coolant fluid, such as water, flows through the coolant tank 140 to cool the cooling plate 142. The coolant fluid may be routed through the tank in any appropriate manner, including through tubing or baffles. Two coolant lines 144, 146 protrude through the coolant tank lid 152 to provide a coolant inlet and a coolant outlet. FIGS. 5 and 6 show alternative placements for the coolant lines 144, 146. The coolant lines 144, 146 attach to a coolant supply and return provided by the manufacturing facility. The coolant tank lid 152 attaches to the coolant tank 140 with a ring of bolts 160 around its perimeter.

The wafer lift apparatus for the embodiment shown in FIG. 5 has an air cylinder 148 for a lift actuator attached to a tie bar 150. A piston (not visible) extends, from the underside of the air cylinder 148 to engage the top of the coolant tank lid 152. For the embodiment shown in FIG. 6, however, the air cylinder 154 for the wafer lift apparatus is mounted to the coolant tank lid 152, and the piston 156 engages the tie bar 150. The tie bar 150 is attached at both of its ends to two guide rods 158. The guide rods 158 protrude through the mounting plate 126 and through the flexible bellows 128 to the wafer supports 120 of the wafer lift assembly. The flexible bellows 128 are attached to the mounting plate 126 and the wafer supports 120 to form an airtight seal, so air cannot leak through the hole for the guide rods 158 into the transfer chamber. The action of the piston 156 and air cylinder 148/154 causes the tie bar 150 to raise or lower. The tie bar 150 raises and lowers the guide rods 158, which raise and lower the wafer supports 120, on which the wafer sits. The flexible bellows 128 extend when the guide rods 158 lower the wafer supports 120 and compress when the guide rods 158 raise the wafer supports 120.

Figure 7:
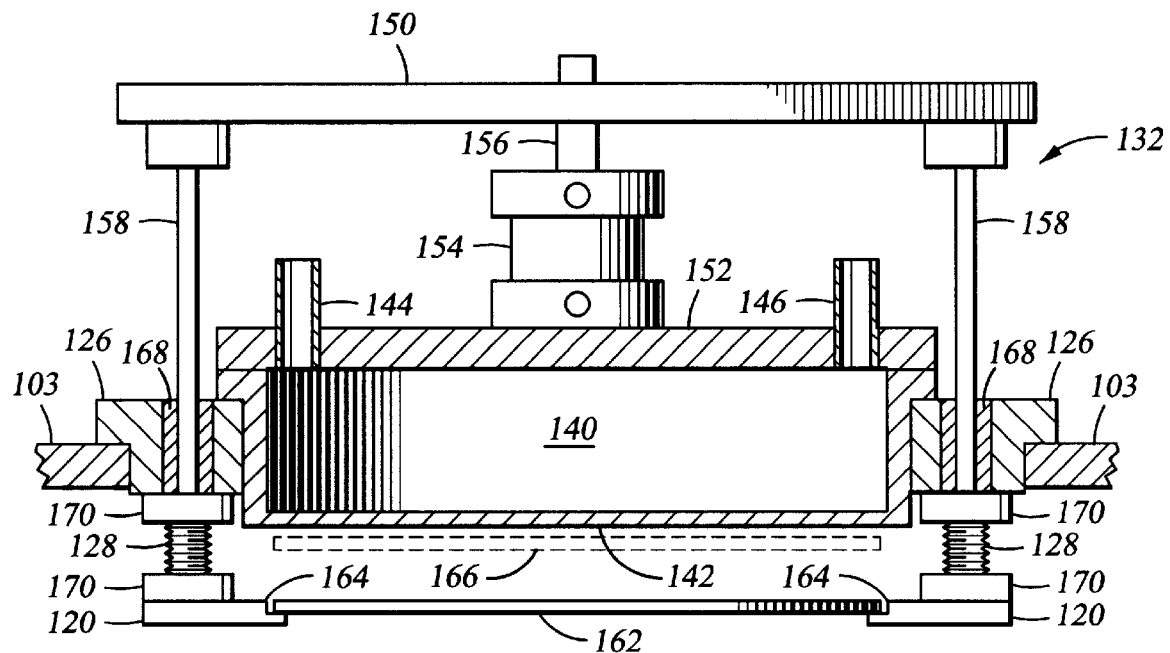
FIG. 7 is a side cross-sectional view of a wafer cooling system.

FIG. 7 shows a cross section of an embodiment of a wafer cooling system 132. The mounting plate 126 is shown mounted to the transfer chamber lid 103. The mounting plate 126 has a hole with a cylindrical bearing 168, such as a bronze bushing, disposed therein for the guide rod 158 to make sliding contact through the mounting plate 126. The flexible bellows 128 are welded to the clamp rings 170, which are attached to the mounting plate 126 above and the wafer support 120 below, to form an airtight seal against an air leak from the outside ambient air. The air cylinder 154 is shown with the piston 156 in the down position, so the wafer lift assembly is in the position for loading or unloading a wafer by a robot blade. A wafer 162 is shown supported on the wafer supports 120. The wafer supports 120 have an optional restraining shoulder 164 for locating the wafer 162 horizontally. A wafer 166 is shown in dashed lines for illustrative purposes in order to demonstrate a wafer in the cooling position when the wafer supports 120 have been fully raised. The gap between the wafer 166 and the cooling plate 142 is about 20 mils during cooling. The wafer lift assembly lifts the wafer 162 to the position of wafer 166 in order to radiate heat to the cooling plate 142. Water, or other coolant, circulates through tank 140 according to the flow rate through the coolant lines 144, 146 in order to remove the heat from the cooling plate 142.

Figure 8:
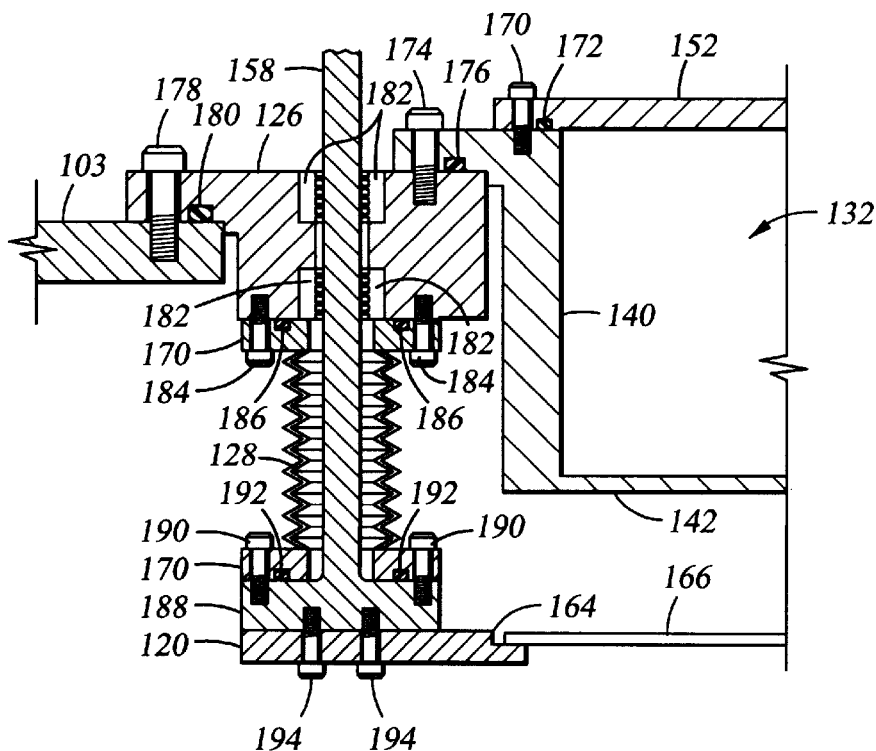
FIG. 8 is a side cross-sectional view of a cut-away portion of a wafer cooling system.

FIG. 8 shows a cut away cross section of another embodiment for the assembly of the wafer cooling system 132. Coolant tank lid 152 is shown attached to the wall of coolant tank 140 with a ring of bolts 170 around the periphery of the coolant tank lid 152. An 0-ring 172 seals the coolant tank lid 152 to the coolant tank 140. The coolant tank 140 is attached to the mounting plate 126 with a plurality of bolts 174 and scaled with O-ring 176. The mounting plate 126 is attached to the transfer chamber lid 103 with a ring of bolts 178 and sealed with O-ring 180. The guide rod 158 is shown in sliding contact through the mounting plate 126 with ball bushings 182. The bellows assembly 128/170 is attached to the mounting plate 126 with bolts 184 and sealed with O-ring 186. The opposite end of bellows assembly 128/170 is attached to a bottom flange 188 of the guide rod 158 with bolts 190 and sealed with O-ring 192. Each of the above attachments and seals provide an airtight seal for the transfer chamber and the coolant tank 140, so that the transfer chamber does not lose its vacuum and the coolant tank 140 does not lose its coolant fluid. The guide rod flange 188 is attached to the wafer support 120 with bolts 194. The wafer supports 120 have the optional restraining shoulder 164. A wafer 166 is shown in dashed lines for illustrative purposes to demonstrate the loading position for a wafer 166 on the wafer support 120. In this configuration, the wafer lift assembly freely raises and lowers the wafer 166 to and from the cooling plate 142 as described above.

Figure 9:
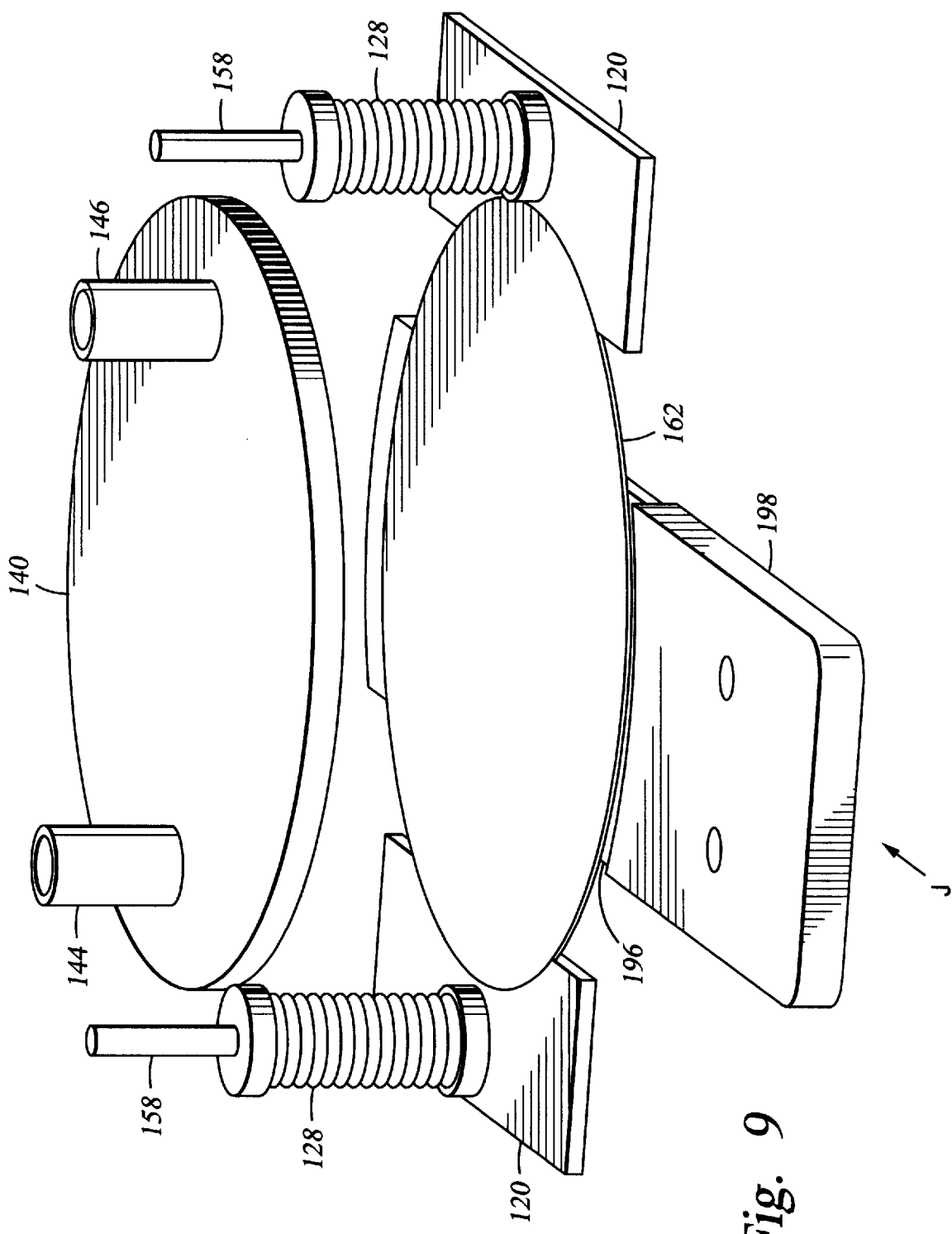
FIG. 9 is a simplified wafer cooling system showing a wafer on a robot blade disposed within the wafer cooling system.

FIG. 9 shows a simplified embodiment of a wafer cooling system 132 showing a wafer lift assembly 120, 128, 158 and a wafer cooler 140, 142, 144, 146. A wafer 162 is shown disposed on a transfer chamber robot's blade 196. The robot blade 196 is attached to a robot wrist 198. The robot wrist 198 is operated by a robot arm (not shown) in order to move the blade 196 in the direction of arrow J and back again. In this configuration, the robot blade 196 may be either providing the wafer 162 to the wafer cooling system 132 or receiving it therefrom. Either way, the blade 196 doesn't have to move vertically, since the wafer supports 1.20 will lift the wafer 162 off of the blade 196 and, after cooling, set it back down onto the blade 196.

While the foregoing is directed to the preferred embodiments of the present invention, other and further embodiments of the invention may be devised without departing from the basic scope thereof, and the scope thereof is determined by the claims which follow.

I claim:

1. A method of cooling a wafer in a vacuum processing system, comprising:

moving a first wafer from a process chamber into a transfer chamber;

lifting the first wafer in the transfer chamber to a position adjacent a first wafer cooling plate disposed on an upper side of the transfer chamber and cooling the first wafer with the first wafer cooling plate while moving a second wafer in the transfer chamber.

2. The method of claim 1, further comprising lifting the second wafer in the transfer chamber to a position adjacent a second wafer cooling plate, and cooling the second wafer with the second wafer cooling plate while moving a third wafer in the transfer chamber.

3. The method of claim 1, wherein the first wafer is cooled while cooling two other wafers with other wafer cooling plates.

4. The method of claim 2, further comprising lifting the third wafer in the transfer chamber to a position adjacent a third wafer cooling plate, and cooling the third wafer with the third wafer cooling plate while moving a fourth wafer in the transfer chamber.

5. The method of claim 2, wherein cooling the second wafer comprises:

moving the second wafer into a position vertically aligned with the second wafer cooling plate;

raising the second wafer to a position proximate to the second wafer cooling plate; and cooling the second wafer while transferring a third wafer through the transfer chamber.

6. The method of claim 5, wherein moving the third wafer into the transfer chamber comprises:

moving the third wafer into a position vertically aligned with a third wafer cooling plate;

raising the third wafer to a position proximate to the third wafer cooler; and cooling the third wafer while moving a fourth wafer through the transfer chamber.

7. A method of cooling a wafer in a vacuum processing system comprising:

moving a first wafer within a vacuum chamber to a position vertically aligned with a first wafer cooler;

raising the first wafer to a position vertically proximate to the first wafer cooler; and cooling the first wafer while cooling a second wafer in the vacuum chamber.

8. A vacuum processing system, comprising:

a transfer chamber having a body and a lid;

one or more process chambers attached to the transfer chamber; and a wafer lift assembly comprising:
   one or more wafer supports;
   a lift actuator mounted on the transfer chamber lid; and
   a motion translator attached to the lift actuator and to the one or more wafer supports and extending through the lid.

9. The vacuum processing system of claim 8, further comprising:

a cooling plate mounted on the lid of the transfer chamber; and a coolant fluid chamber disposed on the cooling plate in heat-conductive contact with the cooling plate.

10. The vacuum processing system of claim 8, wherein:

the transfer chamber further comprises an access port for providing access to a process chamber; and the one or more wafer supports are aligned with the access port so that removing the wafer from the process chamber to the transfer chamber delivers the wafer to the one or more wafer supports.

11. The vacuum processing system of claim 10 wherein the transfer chamber further comprises:

a wafer mover for transferring the wafer within the transfer chamber.

12. A vacuum processing system comprising:

a first chamber;

a second chamber attached to the first chamber and having an interior;

a wafer mover for moving a wafer from the first chamber to the second chamber; and two or more wafer coolers disposed within the second chamber on an upper side of the interior of the second chamber.

13. A vacuum chamber for use in a vacuum processing system, the vacuum chamber comprising:

a first opening connecting the vacuum chamber and a first chamber;

a second opening connecting the vacuum chamber and a second chamber;

a wafer mover adapted to move a wafer between the first opening and the second opening;

a wafer holder disposed within the vacuum chamber to receive the wafer from the wafer mover, wherein the wafer holder includes a wafer lift assembly comprising:

a wafer support; and a lift apparatus attached to the wafer support and disposed on an upper surface of the vacuum chamber.

14. The vacuum chamber of claim 13 further comprising:

a wafer cooler disposed on the upper surface of the vacuum chamber adjacent the wafer holder.

15. The vacuum chamber of claim 14, wherein the wafer cooler comprises:

a cooling plate mounted on an upper surface of the vacuum chamber; and a coolant fluid chamber, disposed above the cooling plate in heat-conductive contact with the cooling plate.

16. A wafer cooling system for use in a vacuum chamber, the vacuum chamber having a lid and a wafer cooling system mounted on the lid, the wafer cooling system comprising:

a wafer support; and a lifting mechanism mounted on the lid and attached to the wafer support.

17. The wafer cooling system of claim 16, further comprising:

a wafer cooler adapted for mounting in the lid proximate to the lifting mechanism.

18. The wafer cooling system of claim 17, wherein the wafer cooler includes:

a cooling plate; and a coolant fluid chamber, disposed above the cooling plate in heat-conductive contact with the cooling plate.

19. The wafer cooling system of claim 17, wherein the lifting mechanism includes:

a lift actuator; and a motion translator attached to the lift actuator and to the wafer support.

\* \* \* \* \*

UNITED STATES PATENT AND TRADEMARK OFFICE
CERTIFICATE OF CORRECTION

PATENT NO : 6,000,227

DATED : December 14, 1999

INVENTOR(S): Tony Kroeker

It is certified that error appears in the above-identified patent and that said Letters Patent are hereby corrected as shown below:

In column 7, line 60, please replace " 1.20" with " 120" .

Signed and Sealed this

Ninth Day of May, 2000

Attest:

Q. TODD DICKINSON

*Attesting Officer*  *Director of Patents and Trademarks*